United States Patent
Chiu et al.

(10) Patent No.: US 10,425,038 B2
(45) Date of Patent: Sep. 24, 2019

(54) LC-TANK OSCILLATOR HAVING INTRINSIC LOW-PASS FILTER

(71) Applicant: MEDIATEK INC., Hsin-Chu (TW)

(72) Inventors: Wei-Hao Chiu, Taichung (TW); Tzu-Chan Chueh, Hsinchu County (TW); Ang-Sheng Lin, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 48 days.

(21) Appl. No.: 15/262,003

(22) Filed: Sep. 11, 2016

(65) Prior Publication Data

US 2017/0111009 A1    Apr. 20, 2017

Related U.S. Application Data

(60) Provisional application No. 62/241,723, filed on Oct. 14, 2015.

(51) Int. Cl.
| | |
|---|---|
| *H03B 5/08* | (2006.01) |
| *H03B 5/18* | (2006.01) |
| *H03B 5/12* | (2006.01) |

(52) U.S. Cl.
CPC ......... *H03B 5/1212* (2013.01); *H03B 5/1228* (2013.01); *H03B 5/1268* (2013.01); *H03B 2200/0082* (2013.01)

(58) Field of Classification Search
CPC .. H03B 5/1212; H03B 5/1268; H03B 5/1228; H03B 2200/0082
USPC ................................ 331/117 R, 117 FE, 167
See application file for complete search history.

(56) References Cited

U.S. PATENT DOCUMENTS

| | | | |
|---|---|---|---|
| 9,083,349 B1 * | 7/2015 | Townsend ................. | H03L 5/00 |
| 2004/0150485 A1 | 8/2004 | Muramatsu | |
| 2005/0168296 A1 | 8/2005 | Schulz | |
| 2009/0051453 A1 * | 2/2009 | Chung ................. | H03B 5/1228 |
| | | | 331/117 R |
| 2009/0189704 A1 * | 7/2009 | Li ........................ | H03B 5/1228 |
| | | | 331/117 R |
| 2009/0251177 A1 * | 10/2009 | Jang ....................... | H03B 19/14 |
| | | | 327/118 |

(Continued)

OTHER PUBLICATIONS

Ping Wing Lai, "A 2.4GHz SiGe Low Phase-Noise VCO Using On Chip Tapped inductor", IEEE, 2003.

(Continued)

*Primary Examiner* — Richard Tan
(74) *Attorney, Agent, or Firm* — Winston Hsu

(57) ABSTRACT

An oscillator for generating oscillation signals at two output terminals includes an inductor coupled between the two output terminals, a capacitor coupled between the two output terminals, two P-type transistors and two N-type transistors. Source electrodes of the two P-type transistors are coupled to a supply voltage, and gate electrodes of the two P-type transistors are coupled to the two output terminals, respectively. Source electrodes of the two N-type transistors are coupled to a supply voltage, gate electrodes of the two N-type transistors are coupled to the two output terminals, respectively, and drain electrodes of the two N-type transistors are coupled to drain electrodes of the two P-type transistors, respectively. In addition, the drain electrodes of the two N-type transistors are coupled to two internal nodes of the inductor.

27 Claims, 11 Drawing Sheets

(56) References Cited

U.S. PATENT DOCUMENTS

2011/0230155 A1* 9/2011 Sapone ............... H04B 1/26
                                                         455/208
2012/0001699 A1   1/2012 Yang

OTHER PUBLICATIONS

Yusuke Wachi, "A 28GHz Low-Phase-Noise CMOS VCO Using an Amplitude-Redistribution Technique", IEEE International Solid-State Circuits Conference, 2008.
Lianming Li, "A 60-GHz CMOS VCO Using Capacitance-Splitting and Gate-Drain Impedance-Balancing Techniques", IEEE Transactions on Microwave Theory and Techniques, vol. 59, No. 2, Feb. 2011.
Masoud Babaie, "A Class-F CMOS Oscillator", IEEE Journal of Solid-State Circuits, vol. 48, No. 12, Dec. 2013.
Bodhisatwa Sadhu, "A Linearized, Low-Phase-Noise VCO-Based 25-GHz PLL With Autonomic Biasing", IEEE Journal of Solid-State Circuits, vol. 48, No. 5, May 2013.
Behzad Razavi, "A Millimeter-Wave Circuit Technique", IEEE Journal of Solid-State Circuits, vol. 43, No. 9, Sep. 2008.
Suman P. Sah, "An Inductively Gm Enhanced 34-GHz VCO with Gain Linearization and Switched Transformer Tuning", IEEE, 2014.
Salvatore Levantino, "Suppression of Flicker Noise Upconversion in a 65nm CMOS VCO in the 3.0-to-3.6GHz Band", IEEE International Solid-State Circuits Conference, 2010.

\* cited by examiner

LC-TANK OSCILLATOR HAVING INTRINSIC LOW-PASS FILTER

CROSS REFERENCE TO RELATED APPLICATIONS

This application claims the priority of U.S. Provisional Application No. 62/241,723, filed on Oct. 14, 2015, which is included herein by reference in its entirety.

BACKGROUND

Recently, a low supply voltage has been a major solution for low-power system. However, for a digitally controlled oscillator (DCO) or a voltage-controlled oscillator (VCO), the low supply voltage results in a small swing of an oscillation signal, and a signal-to-noise ratio (SNR) will be worse accordingly. To solve the small swing and worse SNR problem, one solution is using a PMOS-only VCO or an NMOS-only VCO to double the swing, however, the PMOS-only VCO or NMOS-only VCO has high power consumption, and the high swing signal may destroy the transistors manufactured by advanced process.

In addition, another solution is to increase a current to maintain the power of the signal, however, as the current is increased, the inductance must be decreased, and the capacitance needs to be increased accordingly, hence causing some side effect. For example, if the supply voltage changes from 1.6V to 0.8V, the inductance must be 0.25× (i.e. 0.25 times the original inductance), the capacitance needs to increase by 4×. However, the small inductance may seriously degrade its quality factor (Q), and the VCO/DCO needs more power to compensate the performance. In addition, if parallel inductors are designed and the transconductance pair (gm-pair) feeds to a low impedance node to overcome the low quality factor issue, the VCO/DCO also has a parasitic oscillation issue.

SUMMARY

It is therefore an objective of the present invention to provide a VCO/DCO, which has a low supply voltage, and is capable of generating high swing oscillation signal without destroying the transistors, to solve the above-mentioned problems.

According to one embodiment of the present invention, an oscillator for generating oscillation signals at two output terminals comprises an inductor coupled between the two output terminals, a capacitor coupled between the two output terminals, two P-type transistors and two N-type transistors. Source electrodes of the two P-type transistors are coupled to a supply voltage, and gate electrodes of the two P-type transistors are coupled to the two output terminals, respectively. Source electrodes of the two N-type transistors are coupled to a supply voltage, gate electrodes of the two N-type transistors are coupled to the two output terminals, respectively, and drain electrodes of the two N-type transistors are coupled to drain electrodes of the two P-type transistors, respectively. In addition, the drain electrodes of the two N-type transistors are coupled to two internal nodes of the inductor.

According to another embodiment of the present invention, an oscillator for generating oscillation signals at two output terminals comprises two P-type transistors, two N-type transistors and a low-pass filter. Source electrodes of the two P-type transistors are coupled to a supply voltage, and gate electrodes of the two P-type transistors are coupled to the two output terminals, respectively. Source electrodes of the two N-type transistors are coupled to a supply voltage, gate electrodes of the two N-type transistors are coupled to the two output terminals, respectively, and drain electrodes of the two N-type transistors are coupled to drain electrodes of the two P-type transistors, respectively. In addition, the low-pass filter is coupled to the two P-type transistors and the two N-type transistors, and is arranged for filtering a frequency component of the oscillation signals generated according to a first inductor and a parasitic capacitance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1A:
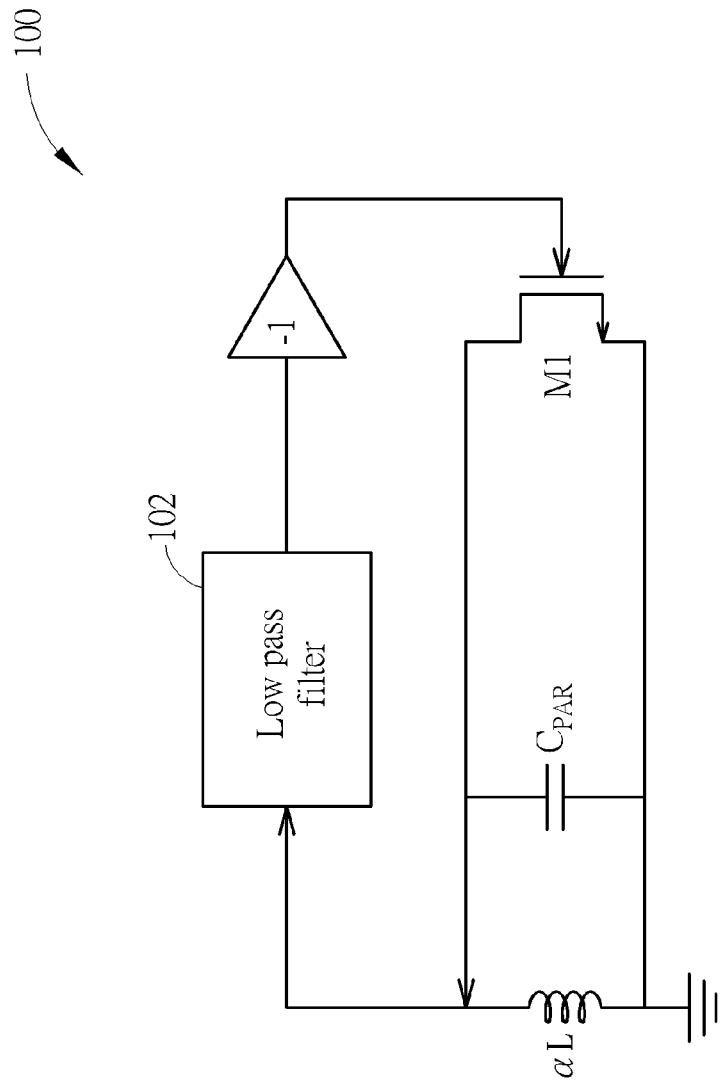
FIG. 1A is a diagram illustrating a concept of a signal model of a VCO/DCO according to one embodiment of the present invention.

Please refer to FIG. 1A, which is a diagram illustrating a concept of a signal model of an oscillator 100 according to one embodiment of the present invention. In this embodiment, the oscillator 100 is a VCO or a DCO. As shown in FIG. 1A, because the oscillator 100 has a parasitic capacitance $C_{PAR}$ and the parasitic capacitance $C_{PAR}$ and a portion of inductor $\alpha*L$ may generate an unwanted high frequency component, the oscillator 100 designs a low-pass filter 102 (e.g. RC filter or LC filter) to filter this unwanted high frequency component. The transistor M1 shown in FIG. 1A is one of a NMOS pair in the oscillator 100.

Figure 1B:
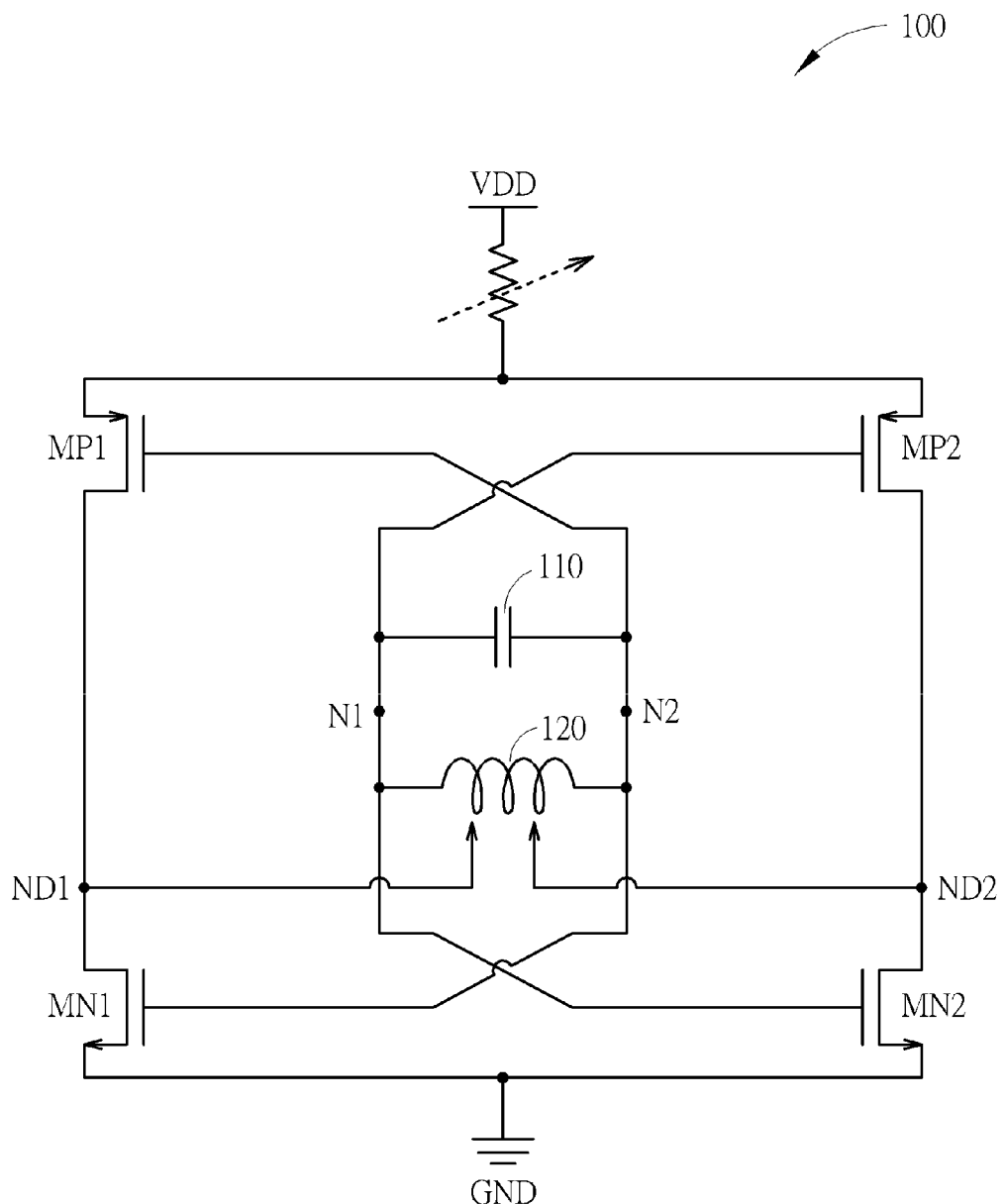
FIG. 1B is a diagram illustrating an oscillator according to one embodiment of the present invention.

Please refer to FIG. 1B, which is a diagram illustrating an exemplary embodiment of the oscillator 100 with reference to FIG. 1A. As shown in FIG. 1B, the oscillator 100 comprises a capacitor 110, an inductor 120, two PMOSs MP1 and MP2, and two NMOSs MN1 and MN2. In this embodiment, the inductor 120 and the capacitor 110 are connected in parallel to form an oscillation circuit; the PMOSs MP1 and MP2 are coupled to a supply voltage VDD, and gate electrodes of the PMOSs MP1 and MP2 are coupled to two output terminals N2 and N1, respectively; the NMOSs MN1 and MN2 are coupled to a ground voltage GND, gate electrodes of the NMOSs MN1 and MN2 are coupled to the output terminals N2 and N1, respectively, and drain electrodes (ND1 and ND2) of the NMOSs MN1 and MN2 are coupled to drain electrodes of the NMOSs MN1 and MN2, respectively. In addition, the drain electrodes ND1 and ND2 of the NMOSs MN1 and MN2 are coupled to two internal nodes of the inductor 120.

In this embodiment, the oscillator 100 is a LC-tank DCO or VCO, the capacitor 110 may be implemented by a switch capacitor array, and an internal node of the capacitor 110 may serve as an input terminal of the oscillator 100; and the oscillator 100 may receive a control voltage at the input terminal to generate oscillation signals at the output terminals N1 and N2.

Figure 2:
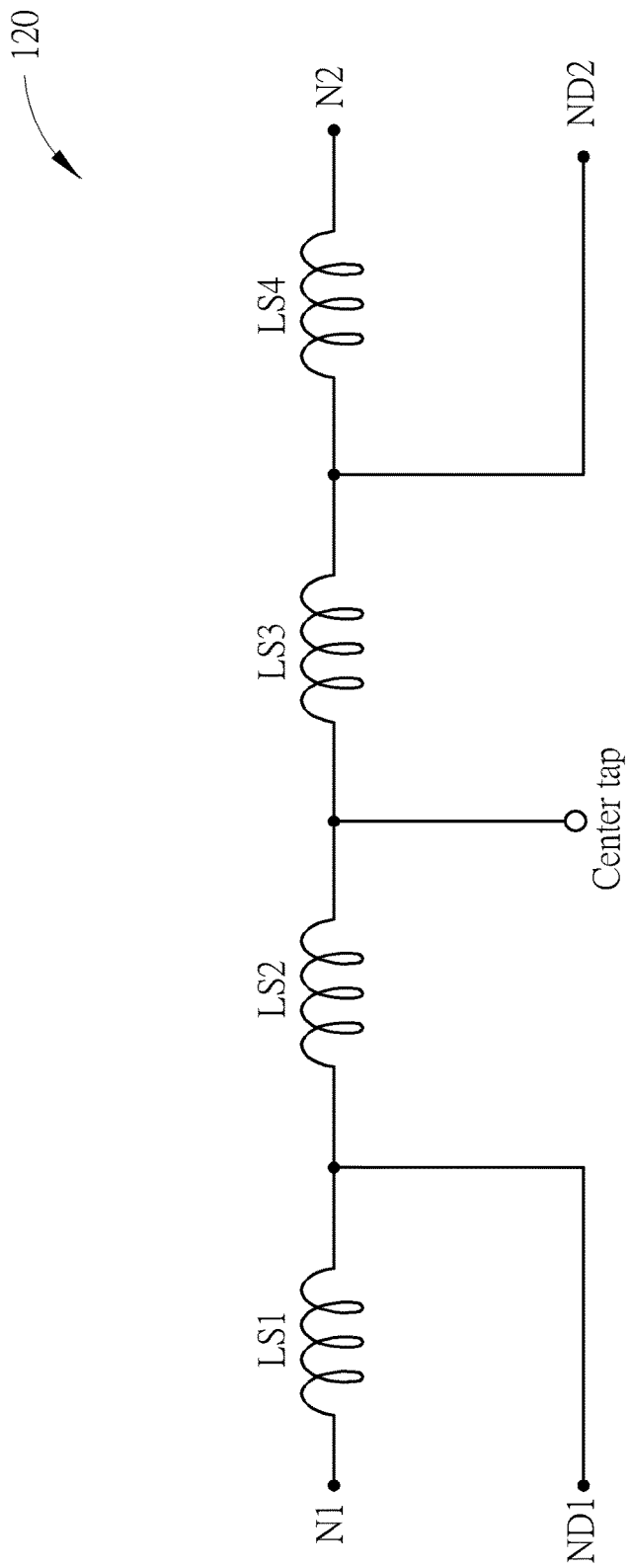
FIG. 2 shows the inductor and the connections according to one embodiment of the present invention.

FIG. 2 shows the inductor 120 and the connections according to one embodiment of the present invention. As shown in FIG. 2, the inductor 120 comprises a plurality of segments LS1-LS4, the drain electrode ND1 of the NMOS MN1 is connected to an internal node between the segments LS1 and LS2, the drain electrode ND2 of the NMOS MN2 is connected to an internal node between the segments LS3 and LS4, and an internal node between the segments LS2 and LS3 is connected to a center tap to receive a DC voltage. In this embodiment, the inductor 120 can by any type of integrated inductor such as an 8-shape inductor.

Figure 3:
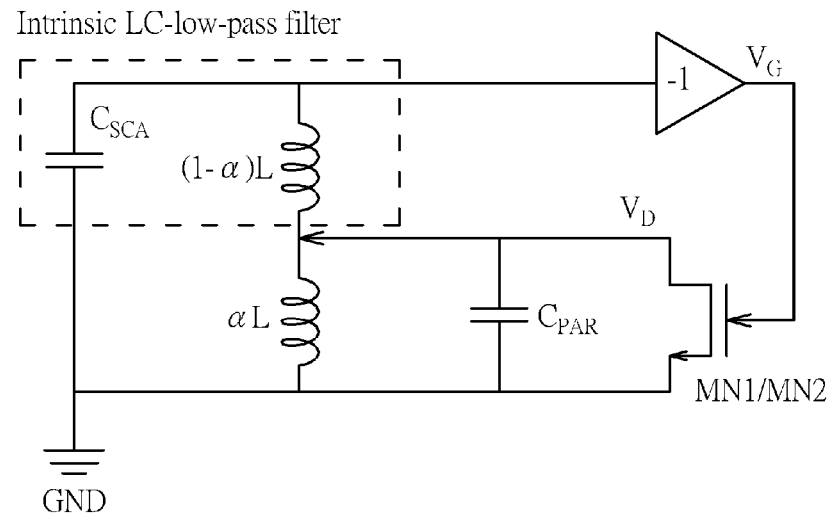
FIG. 3 is an equivalent model of the oscillator according to one embodiment of the present invention.
Figure 3:
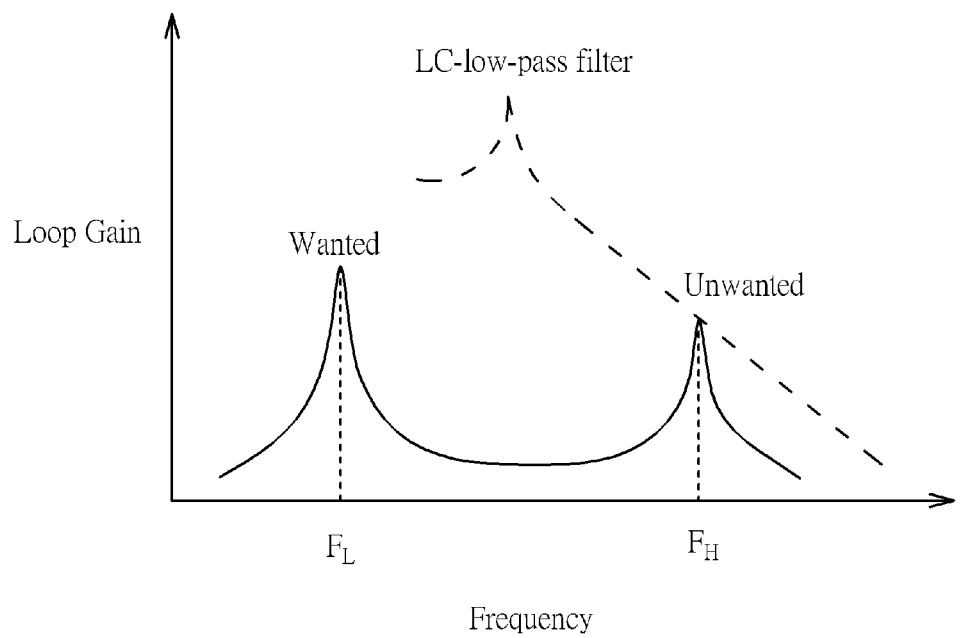

Please refer to FIG. 3, which is an equivalent model of the oscillator 100 shown in FIG. 2 according to one embodiment of the present invention, where the equivalent model shown in FIG. 3 is also an embodiment of the oscillator 100 shown in FIG. 1. As shown in FIG. 3, because the drain electrode ND1/ND2 of the NMOS MN1/MN2 is connected to the internal node of the inductor 120, the equivalent inductance of the inductor 120 for a capacitance $C_{SCA}$ of the capacitor 110 is $(\alpha*L+(1-\alpha)*L)$, and the equivalent inductance of the inductor 120 for a parasitic capacitance $C_{PAR}$ is $(\alpha*L//(1-\alpha)*L)$. In addition, because of the parasitic capacitance $C_{PAR}$ shown in FIG. 3, the oscillation signals may have an unwanted frequency component generated by the parasitic capacitance $C_{PAR}$ and the inductance $\alpha*L$ of a portion of the inductor 120. In other words, the oscillation signals may have two main frequency components, one is the desired frequency component) $F_L=1/\sqrt{L*C_{SCA}}$, and the other one is the unwanted high frequency component $F_H=1/\sqrt{\alpha*L//(1-\alpha)*L)*C_{PAR}}$. In this embodiment, the capacitance $C_{SCA}$ of the capacitor 110 and the inductance $(1-\alpha)*L$ of a portion of the inductor 120 form an intrinsic LC-low-pass filter to lower the loop gain of the unwanted high frequency component $F_H$.

Figure 4:
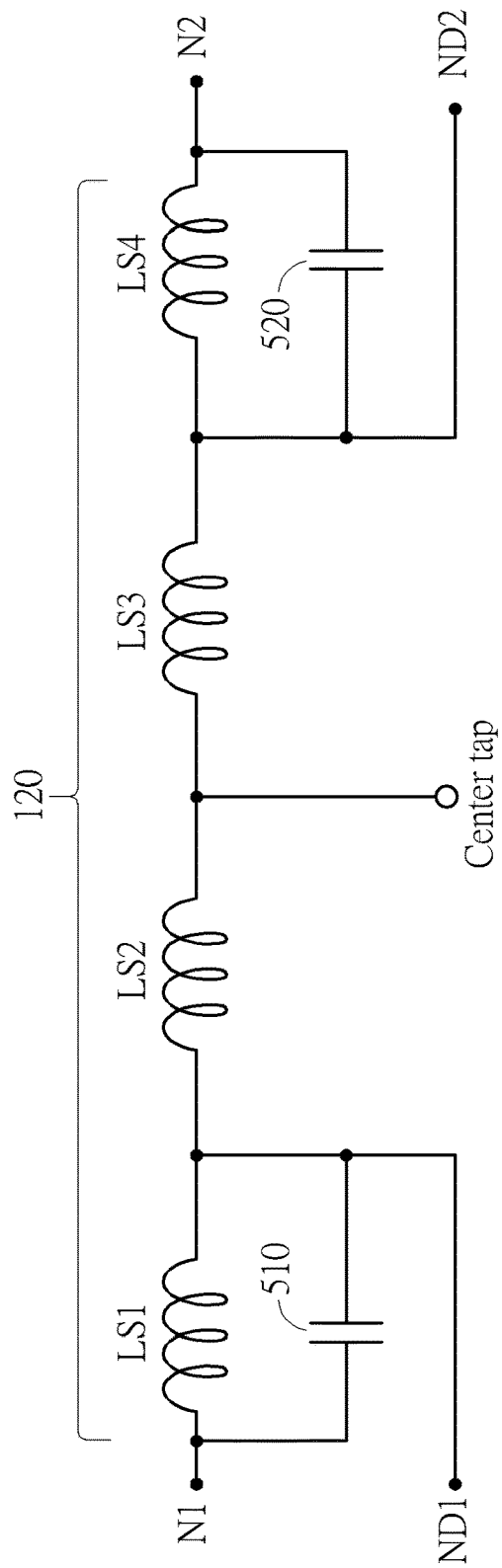
FIG. 4 shows two auxiliary capacitors and the inductor according to one embodiment of the present invention.
Figure 5:
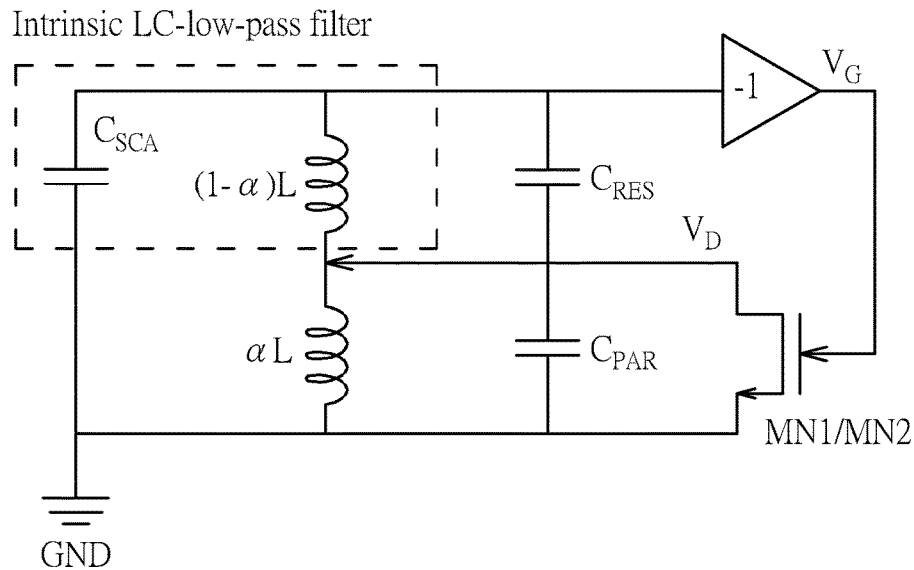
FIG. 5 is an equivalent model of the oscillator according to another embodiment of the present invention.
Figure 5:
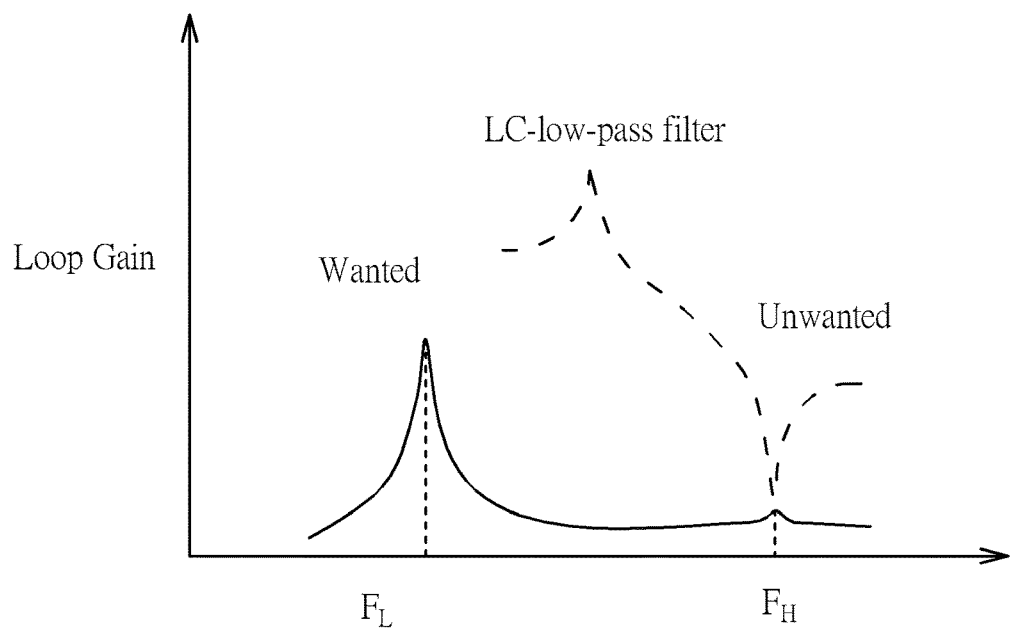

In another embodiment, the oscillator 100 can be modified to add two auxiliary capacitors to lower the loop gain of the unwanted high frequency component $F_H$ more. Please refer to FIG. 4, which shows two auxiliary capacitors 510 and 520 and the inductor 120 according to one embodiment of the present invention. As shown in FIG. 4, the auxiliary capacitor 510 is coupled between the output terminal N1 and the drain electrode ND1 of the NMOS MN1, that is the auxiliary capacitor 510 is connected in parallel with the segment LS1 of the inductor 120; and the auxiliary capacitor 520 is coupled between the output terminal N2 and the drain electrode ND2 of the NMOS MN2, that is the auxiliary capacitor 520 is connected in parallel with the segment LS4 of the inductor 120. Referring to FIG. 5, the auxiliary capacitors 510 and 520 further make the intrinsic LC-low-pass filter to have a notch at the unwanted high frequency component $F_H$, thereby the loop gain of the unwanted high frequency component $F_H$ can be lowered more.

In one embodiment, capacitances of the auxiliary capacitors 510 and 520 can be designed to satisfy an equation: $\alpha*L*C_{PAR}=(1-\alpha)*L*C_{RES}$, where $C_{RES}$ is the capacitance of the auxiliary capacitor 510 or 520.

In addition, in the oscillator 100, because the inductor 120 shown in FIG. 2 can perform as a voltage divider, and the drain electrodes ND1/ND2 of the NMOSs MN1 and MN2 are connected to the internal nodes of the inductor 120, and the gate electrode of the of the NMOSs MN1 and MN2 are connected to the output terminals N2 and N1, the swing of the drain voltages VD of the NMOSs MN1 and MN2 may be close to the supply voltage VDD, and the swing of the gate voltages $V_G$ of the NMOSs MN1 and MN2 will be larger than the swing of the drain voltages $V_D$. For example, if $\alpha=0.5$ and the supply voltage VDD=0.9V, the maximum drain voltage $V_D$ may be close to 0.9V, and the maximum gate voltage $V_G$ may be close to 1.8V that is much greater than the supply voltage VDD. In light of the above mentioned, the lower drain voltage $V_D$ can prevent the NMOSs MN1/MN2 and the PMOSs MP1/MP2 from being destroyed, and the high swing gate voltage $V_G$ (i.e. high swing oscillation signals) can increase the SNR of the oscillation signals.

In addition, because the gate voltage $V_G$ of the NMOS MN1/MN2 has the large swing, a gate-source voltage (Vgs) will be larger to increase the current. Therefore, under a condition that the performance may satisfy a criteria, the transistor size can be decreased to lower the parasitic capacitance.

Figure 6:
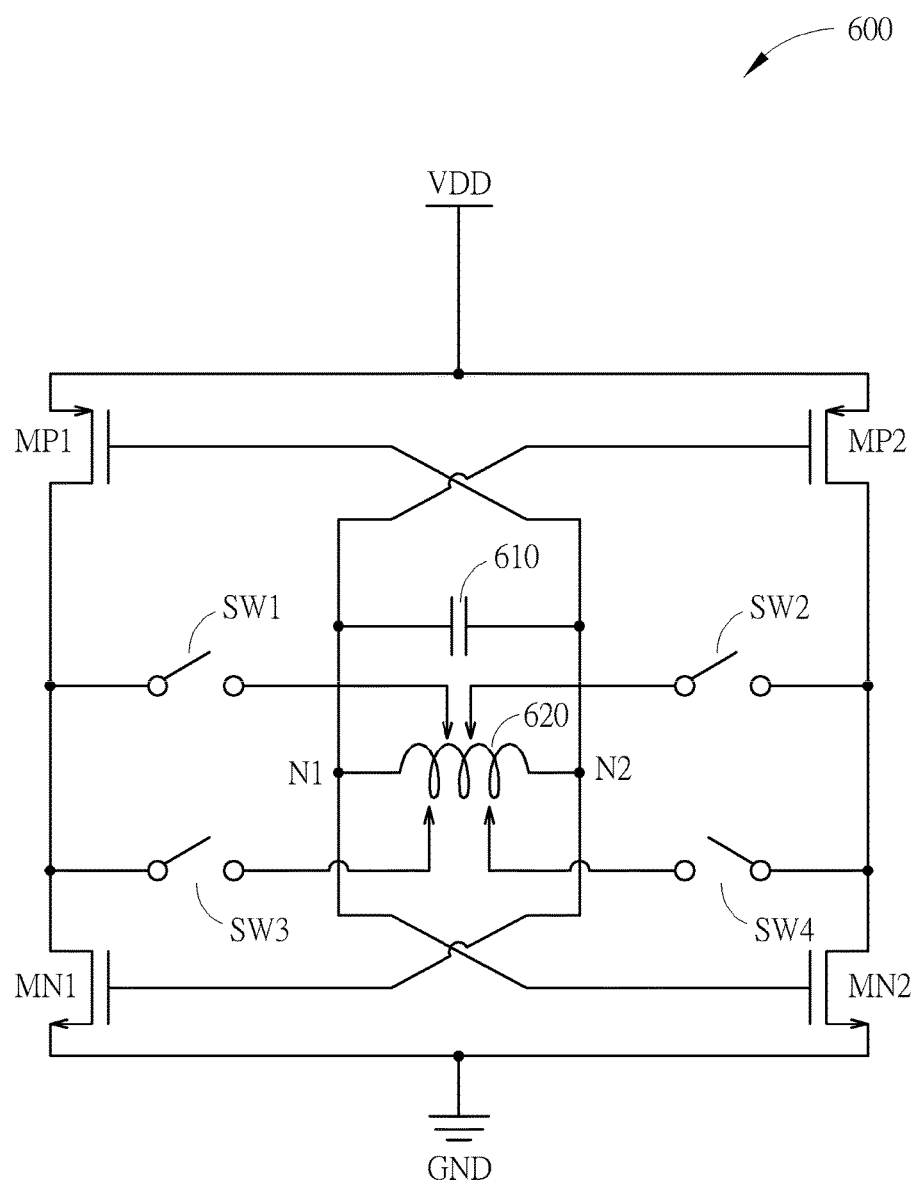
FIG. 6 is a diagram illustrating an oscillator according to another embodiment of the present invention.

In the above-mentioned embodiment, the inductances of the segments LS1-LS4 of the inductor 120 are predetermined, that is, the "$\alpha$" value cannot be adjusted. In another embodiment, however, the oscillator may be designed to select different "$\alpha$" value. In detail, please refer to FIG. 6, which is a diagram illustrating an oscillator 600 according to one embodiment of the present invention. As shown in FIG. 6, the oscillator 600 comprises a capacitor 610, an inductor 620, two PMOSs MP1 and MP2, two NMOSs MN1 and MN2, and a switch module comprising a plurality of switches SW1-SW4. In this embodiment, the inductor 620 and the capacitor 610 are connected in parallel to form an oscillation circuit; the PMOSs MP1 and MP2 are coupled to a supply voltage VDD, and gate electrodes of the PMOSs MP1 and MP2 are coupled to two output terminals N2 and N1, respectively; the NMOSs MN1 and MN2 are coupled to a ground voltage GND, gate electrodes of the NMOSs MN1 and MN2 are coupled to the output terminals N2 and N1, respectively, and drain electrodes of the NMOSs MN1 and MN2 are coupled to drain electrodes of the NMOSs MN1 and MN2, respectively. In addition, the switch SW1 is arranged to selectively connect the drain electrode of the NMOS MN1 to a first internal node of the inductor 620; the switch SW2 is arranged to selectively connect the drain electrode of the NMOS MN2 to a second internal node of the inductor 620; the switch SW3 is arranged to selectively connect the drain electrode of the NMOS MN1 to a third internal node of the inductor 620; and the switch SW4 is arranged to selectively connect the drain electrode of the NMOS MN2 to a fourth internal node of the inductor 620.

Figure 7:
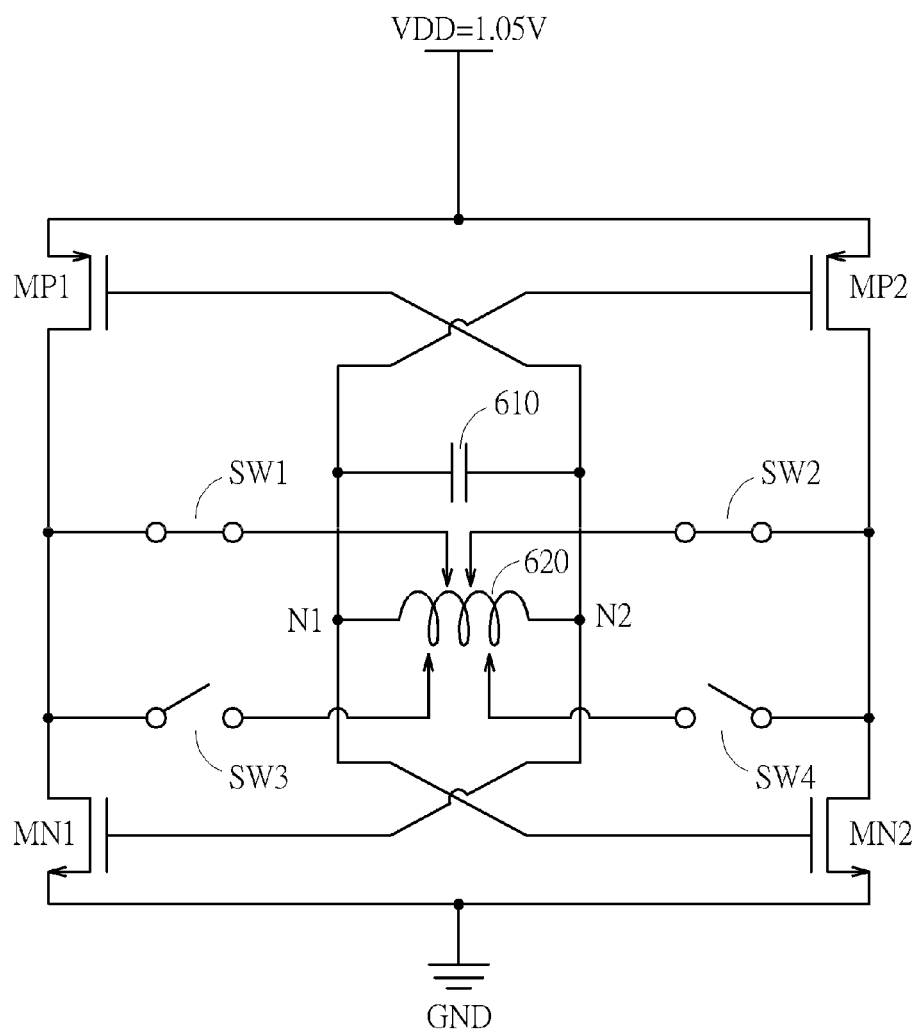
FIG. 7 is a diagram illustrating the oscillator shown in FIG. 6 when the oscillator operates in the high current mode according to one embodiment of the present invention.
Figure 8:
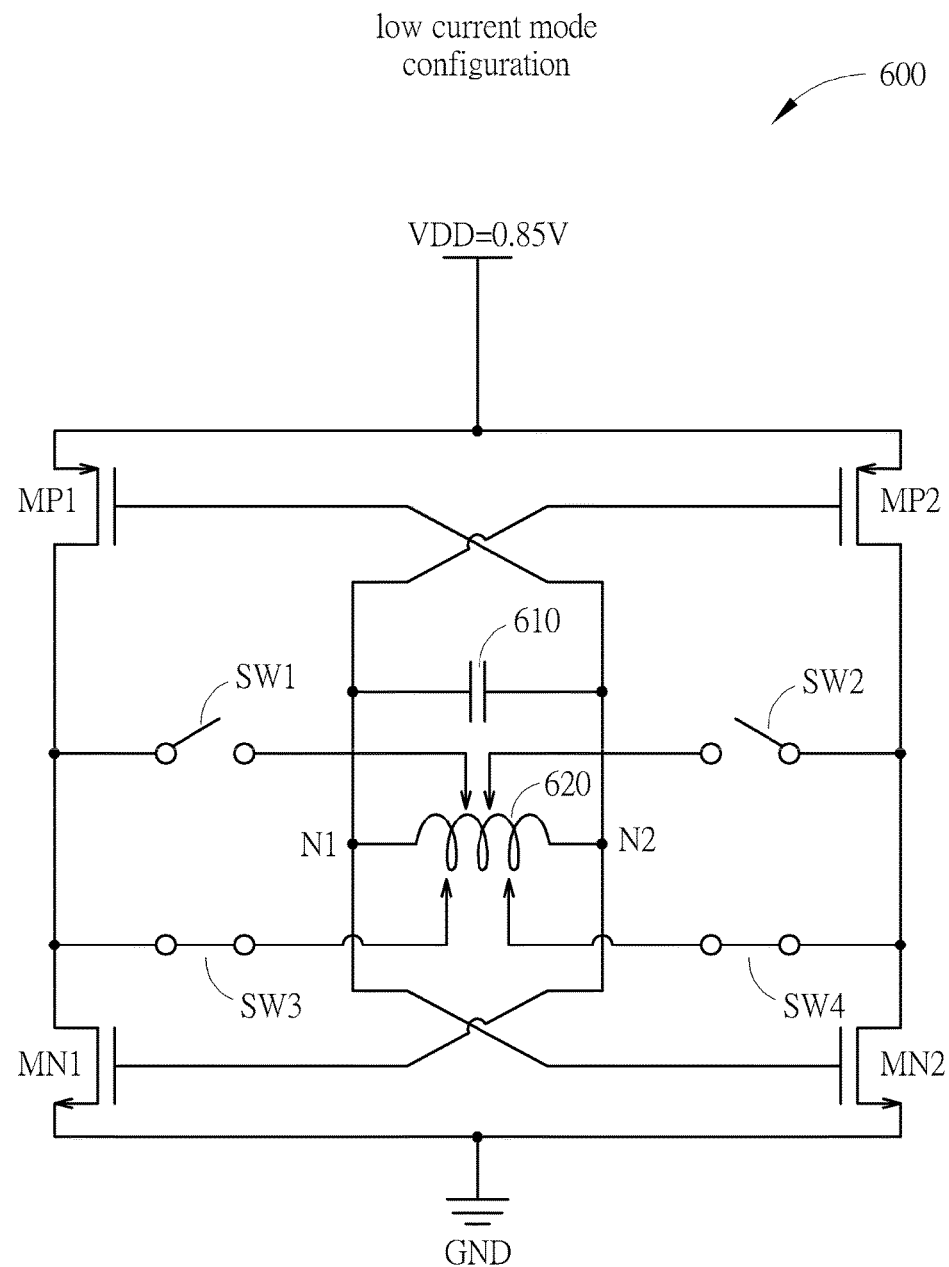
FIG. 8 is a diagram illustrating the oscillator shown in FIG. 6 when the oscillator operates in the low current mode according to one embodiment of the present invention.

By turning on or turning off the switches SW1-SW4, the inductor 620 may be divided to have different portions with different inductances, that is the "α" value of the equivalent model shown in FIG. 3 can be selected. By selecting the "α" value, the characteristics of the oscillator 600, such as the swing of the oscillation signals, may be changed. For example, in FIG. 7, when the oscillator 600 operates in a high current mode (e.g. 2G mode), the oscillator 600 may have the higher supply voltage VDD (e.g. 1.05V), the switches SW1 and SW2 are turned on while the switches SW3 and SW4 are turned off to make the inductor 120 to have a first "α" value. In addition, in FIG. 8, when the oscillator 600 operates in a low current mode (e.g. Long Term Evolution (LTE) mode), the oscillator 600 may have the lower supply voltage VDD (e.g. 0.85V), the switches SW1 and SW2 are turned off while the switches SW3 and SW4 are turned on to make the inductor 120 to have a second "α" value.

Figure 9:
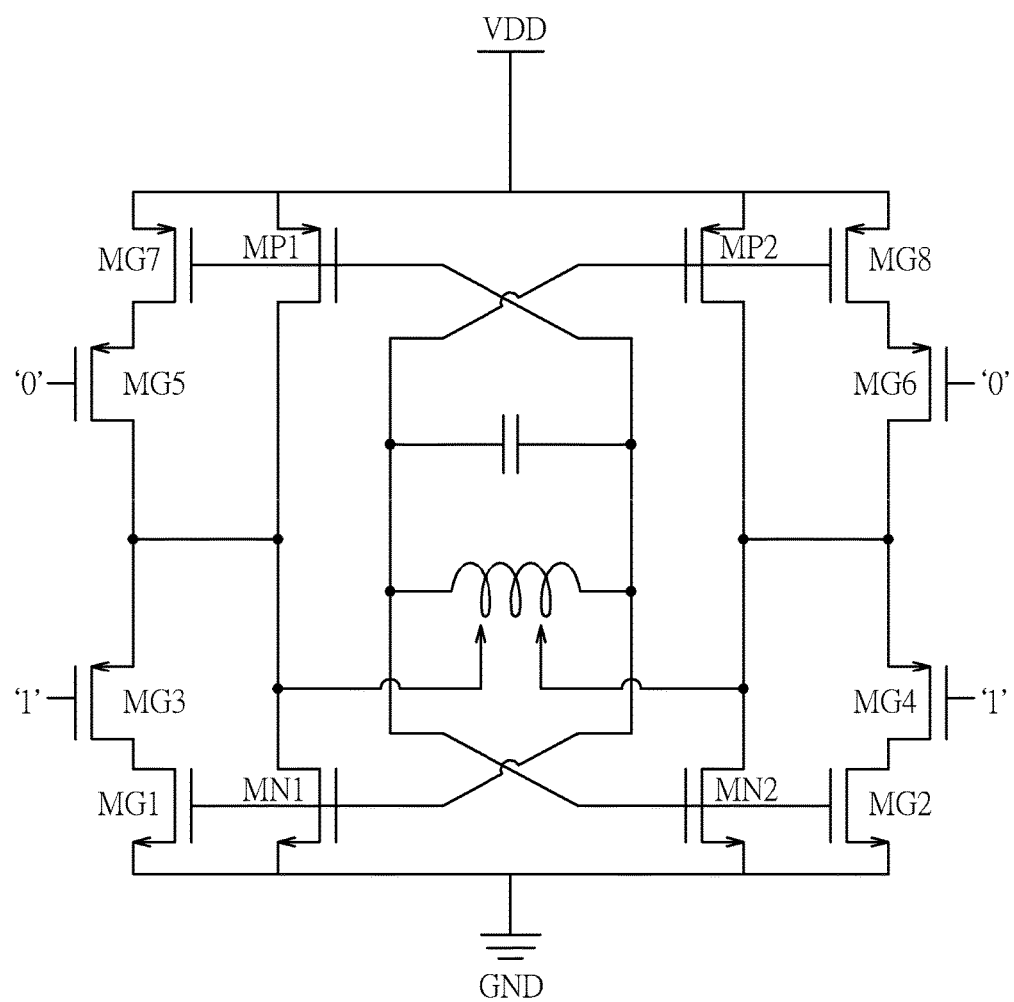
FIG. 9 is a diagram illustrating the oscillator when the oscillator operates in the high current mode according to another embodiment of the present invention.
Figure 10:
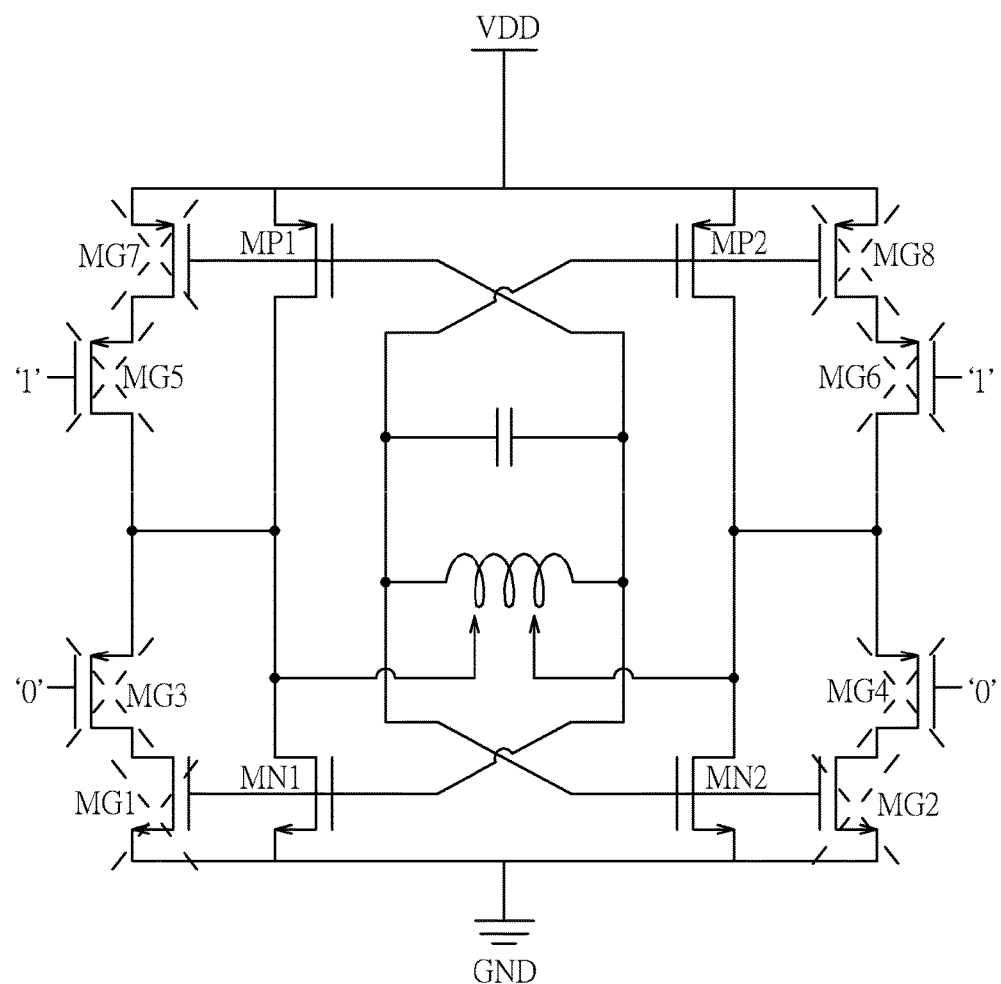
FIG. 10 is a diagram illustrating the oscillator when the oscillator operates in the low current mode according to another embodiment of the present invention.

Please refer to FIG. 9 and FIG. 10, which are diagrams illustrating an oscillator 900 according to one embodiment of the present invention when the oscillator 900 operates in the high current mode (e.g. 2G mode) and the low current mode (e.g. LTE mode). As shown in FIG. 9, compared with the oscillator 100 shown in FIG. 1, the oscillator 900 further at least comprises a plurality of gating transistors MG1-MG8 to provide a tunable transconductance (gm) pair. In FIG. 9, when the oscillator 900 operates in the high current mode, the gating transistors MG1-MG8 are turned on to provide an additional current, thereby increasing the transconductance (gm) of the transistors within the oscillator 900. On the contrary, In FIG. 10, when the oscillator 900 operates in the low current mode, the gating transistors MG1-MG8 are turned off to save power; meanwhile.

Briefly summarized, in the oscillator of the embodiments, the drain electrodes of the NMOSs and PMOSs are coupled to internal nodes of the inductor, and the gate electrodes of the NMOSs and PMOSs are coupled to the output terminals of the oscillator. Therefore, the inductor may use relative large size to have a small inductance, and the quality factor (Q) will not be degraded due to the small inductance design; and an intrinsic LC-low-pass filter is formed to filter out the unwanted high frequency component. In addition, the output oscillation signals may have higher swing (greater than the supply voltage) to increase the SNR.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator for generating oscillation signals at two output terminals, comprising:
   an inductor coupled between the two output terminals;
   a capacitor coupled between the two output terminals;
   two P-type transistors, wherein source electrodes of the two P-type transistors are coupled to a supply voltage, and gate electrodes of the two P-type transistors are coupled to the two output terminals, respectively; and
   two N-type transistors, wherein gate electrodes of the two N-type transistors are coupled to the two output terminals, respectively, and drain electrodes of the two N-type transistors are directly connected to drain electrodes of the two P-type transistors, respectively;
   wherein the drain electrodes of the two N-type transistors are directly connected to two internal nodes of the inductor; and the capacitor and a portion of the inductor form a low-pass filter for filtering an unwanted frequency component.

2. The oscillator of claim 1, wherein the unwanted frequency component is generated according to another portion of the inductor and a parasitic capacitance.

3. The oscillator of claim 1, further comprising:
   a first auxiliary capacitor, coupled between one of the two output terminals and the drain electrode of one of the two N-type transistors.

4. The oscillator of claim 3, wherein the capacitor, the first auxiliary capacitor and a portion of the inductor form a low-pass filter to filter an unwanted frequency component.

5. The oscillator of claim 4, wherein the unwanted frequency component is generated according to another portion of the inductor and a parasitic capacitance.

6. The oscillator of claim 5, wherein $\alpha*L*C_{PAR}=(1-\alpha)*L*C_{RES}$, $(\alpha*L)$ is an inductance of the another portion of the inductor, $C_{PAR}$ is the parasitic capacitance, $((1-\alpha)*L)$ is an inductance of the portion of the inductor, and $C_{RES}$ is a capacitance of the first auxiliary capacitor.

7. The oscillator of claim 4, further comprising:
   a second auxiliary capacitor, coupled between another one of the two output terminals and the drain electrode of another one of the two N-type transistors.

8. An oscillator for generating oscillation signals at two output terminals, comprising:
   an inductor coupled between the two output terminals;
   a capacitor coupled between the two output terminals;
   two P-type transistors, wherein source electrodes of the two P-type transistors are coupled to a supply voltage, and gate electrodes of the two P-type transistors are coupled to the two output terminals, respectively; and
   two N-type transistors, wherein gate electrodes of the two N-type transistors are coupled to the two output terminals, respectively, and drain electrodes of the two N-type transistors are directly connected to drain electrodes of the two P-type transistors, respectively;
   wherein the drain electrodes of the two N-type transistors are coupled to two internal nodes of the inductor;
   a switch module, coupled between the drain electrodes of two N-type transistors and the two internal nodes of the inductor, for selectively connecting the drain electrodes of two N-type transistors to the two internal nodes of the inductor or not;
   wherein the switch module further selectively connects the drain electrodes of two N-type transistors to other two internal nodes of the inductor or not.

9. The oscillator of claim 8, wherein when the oscillator operates in a first mode, the switch module connects the drain electrodes of two N-type transistors to the two internal nodes of the inductor, and not connect the drain electrodes of two N-type transistors to the other two internal nodes of the inductor; and when the oscillator operates in a second mode, the switch module connects the drain electrodes of two N-type transistors to the other two internal nodes of the inductor, and not connect the drain electrodes of two N-type transistors to the two internal nodes of the inductor.

10. The oscillator of claim 9, wherein the first mode is a Long Term Evolution (LTE) mode, and the second mode is a 2G mode.

11. The oscillator of claim 1, further comprising:
a plurality of gating transistors connected in parallel with the two P-type transistors and the two N-type transistors, respectively, for providing additional current to adjust a transconductance of the oscillator.

12. The oscillator of claim 11, wherein the oscillator operates in a first mode, the gating transistors are turned off; and when the oscillator operates in a second mode, the gating transistors are turned on.

13. The oscillator of claim 12, wherein the first mode is a Long Term Evolution (LTE) mode, and the second mode is a 2G mode.

14. The oscillator of claim 1, wherein the oscillator is a digitally controlled oscillator (DCO) or a voltage-controlled oscillator (VCO).

15. An oscillator for generating oscillation signals at two output terminals, comprising:
two P-type transistors, wherein source electrodes of the two P-type transistors are coupled to a supply voltage, and gate electrodes of the two P-type transistors are coupled to the two output terminals, respectively;
two N-type transistors, wherein gate electrodes of the two N-type transistors are coupled to the two output terminals, respectively, and drain electrodes of the two N-type transistors are coupled to drain electrodes of the two P-type transistors, respectively; and
a low-pass filter, coupled to the two P-type transistors and the two N-type transistors, for filtering a frequency component of the oscillation signals generated according to a first inductor and a parasitic capacitance;
wherein the low-pass filter is formed by a second inductor and a capacitor, and the second inductor is different from the first inductor.

16. The oscillator of claim 15, wherein the low-pass filter is an inductor-capacitor filter.

17. The oscillator of claim 15, wherein a desired frequency component of the oscillation signals is generated according to the first inductor, the second inductor and the capacitor.

18. An oscillator for generating oscillation signals at two output terminals, comprising:
an inductor coupled between the two output terminals;
a capacitor coupled between the two output terminals;
two first transistors, wherein each of the first transistors has a first electrode, a second electrode and a gate electrode, the first electrodes of the two first transistors are coupled to a supply voltage, and the gate electrodes of the two first transistors are coupled to the two output terminals, respectively; and
two second transistors, wherein each of the second transistors has a first electrode, a second electrode and a gate electrode, the gate electrodes of the two second transistors are coupled to the two output terminals, respectively, and the first electrodes of the two second transistors are directly connected to the second electrodes of the two first transistors, respectively;
wherein the first electrodes of the two second transistors are directly connected to two internal nodes of the inductor; and the capacitor and a portion of the inductor form a low-pass filter for filtering an unwanted frequency component.

19. The oscillator of claim 18, wherein the unwanted frequency component is generated according to another portion of the inductor and a parasitic capacitance.

20. An oscillator for generating oscillation signals at two output terminals, comprising:
an inductor coupled between the two output terminals;
a capacitor coupled between the two output terminals;
two first transistors, wherein each of the first transistors has a first electrode, a second electrode and a gate electrode, the first electrodes of the two first transistors are coupled to a supply voltage, and the gate electrodes of the two first transistors are coupled to the two output terminals, respectively; and
two second transistors, wherein each of the second transistors has a first electrode, a second electrode and a gate electrode, the gate electrodes of the two second transistors are coupled to the two output terminals, respectively, and the first electrodes of the two second transistors are directly connected to the second electrodes of the two first transistors, respectively; wherein the first electrodes of the two second transistors are coupled to two internal nodes of the inductor;
a switch module, coupled between the drain electrodes of two second transistors and the two internal nodes of the inductor, for selectively connecting the drain electrodes of two second transistors to the two internal nodes of the inductor or not;
wherein the switch module further selectively connects the drain electrodes of two second transistors to other two internal nodes of the inductor or not.

21. An oscillator for generating oscillation signals at two output terminals, comprising:
an inductor coupled between the two output terminals;
a capacitor coupled between the two output terminals;
two transistors, wherein each of the transistors has a first electrode, a second electrode and a gate electrode, the first electrodes of the two transistors are coupled to a first reference voltage, the second electrodes of the two transistors are coupled to a second reference voltage, and the gate electrodes of the two transistors are coupled to the two output terminals, respectively;
wherein the first electrodes of the two transistors are directly connected to two internal nodes of the inductor; and the capacitor and a portion of the inductor form a low-pass filter for filtering an unwanted frequency component.

22. The oscillator of claim 21, wherein the two transistors are two P-type transistors, the first electrodes are drain electrodes of the two P-type transistors, the second electrodes are source electrodes of the two P-type transistors.

23. The oscillator of claim 21, wherein the two transistors are two N-type transistors, the first electrodes are drain electrodes of the two N-type transistors, the second electrodes are source electrodes of the two N-type transistors.

24. The oscillator of claim 21, wherein the unwanted frequency component is generated according to another portion of the inductor and a parasitic capacitance.

25. An oscillator for generating oscillation signals at two output terminals, comprising:
an inductor coupled between the two output terminals;
a capacitor coupled between the two output terminals;
two transistors, wherein each of the transistors has a first electrode, a second electrode and a gate electrode, the first electrodes of the two transistors are coupled to a first reference voltage, the second electrodes of the two transistors are coupled to a second reference voltage, and the gate electrodes of the two transistors are coupled to the two output terminals, respectively;
wherein the first electrodes of the two transistors are coupled to two internal nodes of the inductor;

a switch module, coupled between the first electrodes of the two transistors and the two internal nodes of the inductor, for selectively connecting the first electrodes of the two transistors to the two internal nodes of the inductor or not;

wherein the switch module further selectively connects the first electrodes of the two transistors to other two internal nodes of the inductor or not.

26. The oscillator of claim 25, wherein the two transistors are two P-type transistors, the first electrodes are drain electrodes of the two P-type transistors, the second electrodes are source electrodes of the two P-type transistors.

27. The oscillator of claim 25, wherein the two transistors are two N-type transistors, the first electrodes are drain electrodes of the two N-type transistors, the second electrodes are source electrodes of the two N-type transistors.

* * * * *